(12) United States Patent
Thompson et al.

(10) Patent No.: US 9,840,409 B2
(45) Date of Patent: Dec. 12, 2017

(54) TRANSLATING Z AXIS ACCELEROMETER

(71) Applicant: InvenSense, Inc., San Jose, CA (US)

(72) Inventors: Matthew Julian Thompson, Beaverton, OR (US); Joseph Seeger, Menlo Park, CA (US)

(73) Assignee: InvenSense, Inc., San Jose, CA (US)

(*) Notice: Subject to any disclaimer, the term of this patent is extended or adjusted under 35 U.S.C. 154(b) by 136 days.

(21) Appl. No.: 14/608,038

(22) Filed: Jan. 28, 2015

(65) Prior Publication Data
US 2016/0214853 A1 Jul. 28, 2016

(51) Int. Cl.
*G01P 15/125* (2006.01)
*B81B 3/00* (2006.01)
*G01P 15/08* (2006.01)

(52) U.S. Cl.
CPC .......... *B81B 3/0016* (2013.01); *G01P 15/125* (2013.01); *B81B 2203/0109* (2013.01); *B81B 2203/0145* (2013.01); *B81B 2203/053* (2013.01); *G01P 2015/086* (2013.01); *G01P 2015/0837* (2013.01); *G01P 2015/0854* (2013.01)

(58) Field of Classification Search
CPC ......... G01P 15/125; G01P 15/18; G01P 15/08
USPC .............................. 73/514.32, 514.36, 514.38
See application file for complete search history.

(56) References Cited

U.S. PATENT DOCUMENTS

| | | | | |
|---|---|---|---|---|
| 5,220,835 A * | 6/1993 | Stephan | .................. | G01P 1/006 73/514.32 |
| 7,578,190 B2 * | 8/2009 | Lin | ....................... | G01P 15/125 73/514.29 |
| 8,205,497 B1 * | 6/2012 | Okandan | ............ | G01C 19/5712 73/514.26 |
| 8,418,556 B2 * | 4/2013 | Chen | .................. | G01R 33/0286 73/514.32 |
| 8,783,108 B2 * | 7/2014 | Classen | ................. | G01P 15/125 73/514.32 |
| 8,973,439 B1 * | 3/2015 | Baldasarre | ............ | G01P 15/125 73/504.12 |

(Continued)

FOREIGN PATENT DOCUMENTS

EP 2315039 A1 4/2011
WO 2014102507 A1 7/2014

OTHER PUBLICATIONS

International Searching Authority, International Search Report and Written Opinion, PCT/US2016/014300, 13 pages, dated Jun. 3, 2016 (Mar. 6, 2016).

*Primary Examiner* — Helen Kwok

(57) ABSTRACT

A system and method for providing a MEMS sensor are disclosed. In a first aspect, the system is a MEMS sensor that comprises a substrate, an anchor region coupled to the substrate, at least one support arm coupled to the anchor region, at least two guiding arms coupled to and moving relative to the at least one support arm, a plurality of sensing elements disposed on the at least two guiding arms to measure motion of the at least two guiding arms relative to the substrate, and a proof mass system comprising at least one mass coupled to each of the at least two guiding arms by a set of springs. The proof mass system is disposed outside the anchor region, the at least one support arm, the at least two guiding arms, the set of springs, and the plurality of sensing elements.

34 Claims, 5 Drawing Sheets

(56) References Cited

U.S. PATENT DOCUMENTS

| | | | |
|---|---|---|---|
| 2004/0079154 A1* | 4/2004 | Yoshikawa | G01P 15/125 73/514.32 |
| 2008/0110260 A1* | 5/2008 | Konno | G01P 15/125 73/514.32 |
| 2010/0139401 A1* | 6/2010 | Schwarzelbach | G01P 15/0802 73/514.32 |
| 2010/0242603 A1* | 9/2010 | Miller | B81B 7/02 73/514.32 |
| 2011/0031959 A1* | 2/2011 | Konno | G01P 15/0888 324/162 |
| 2011/0203373 A1* | 8/2011 | Konno | G01P 15/0802 73/514.32 |
| 2012/0248931 A1* | 10/2012 | Reinmuth | G01L 9/0005 310/300 |
| 2013/0126987 A1* | 5/2013 | Uto | B81C 1/00269 257/414 |
| 2013/0167632 A1* | 7/2013 | Huang | G01R 33/0286 73/493 |
| 2013/0269434 A1* | 10/2013 | Kamisuki | G01P 15/125 73/514.32 |
| 2013/0340526 A1* | 12/2013 | Liu | G01P 15/18 73/514.32 |
| 2014/0007685 A1* | 1/2014 | Zhang | G01P 15/125 73/514.32 |
| 2014/0216156 A1* | 8/2014 | Sakai | G01P 15/125 73/514.32 |
| 2014/0230549 A1 | 8/2014 | McNeil et al. | |
| 2014/0252509 A1* | 9/2014 | Merassi | B81B 3/0072 257/415 |
| 2014/0266170 A1* | 9/2014 | Seeger | G01P 15/08 324/227 |
| 2015/0040667 A1* | 2/2015 | Tanaka | G01P 15/125 73/514.32 |
| 2015/0192603 A1* | 7/2015 | Baldasarre | G01P 15/125 73/514.32 |
| 2015/0268268 A1* | 9/2015 | Liu | G01P 15/125 73/514.32 |
| 2015/0284239 A1* | 10/2015 | Williams | B81B 3/0051 257/417 |
| 2015/0293141 A1* | 10/2015 | Wu | G01P 15/125 73/504.12 |
| 2016/0289063 A1* | 10/2016 | Ocak | B81B 7/0048 |

* cited by examiner

TRANSLATING Z AXIS ACCELEROMETER

FIELD OF THE INVENTION

The present invention relates to microelectromechanical system (MEMS) sensors, and more particularly, to MEMS Z axis accelerometers.

BACKGROUND

Conventional microelectromechanical system (MEMS) sensors experience a variety of shock conditions that damage the MEMS sensors and lead to stiction. Stiction is when the moving section of the MEMS sensor gets stuck which causes failures of the MEMS sensor. Therefore, there is a strong need for a solution that overcomes the aforementioned issues. The present invention addresses such a need.

SUMMARY OF THE INVENTION

A system and method for providing a MEMS sensor are disclosed. In a first aspect, the system is a MEMS sensor that comprises a substrate, an anchor region coupled to the substrate, at least one support arm coupled to the anchor region, at least two guiding arms coupled to and moving relative to the at least one support arm, a plurality of sensing elements disposed on the at least two guiding arms to measure motion of the at least two guiding arms relative to the substrate, and a proof mass system coupled to the at least two guiding arms by a set of springs. The proof mass system encircles or is disposed outside the anchor region, the at least one support arm, the at least two guiding arms, the set of springs, and the plurality of sensing elements.

In a second aspect, the system is a MEMS sensor that comprises a substrate, an anchor region coupled to the substrate, at least one support arm coupled to the anchor region, at least two guiding arms coupled to and moving relative to the at least one support arm, a plurality of sensing electrodes disposed on the substrate to measure motion of the at least two guiding arms relative to the substrate, and a proof mass system coupled to each of the at least two guiding arms via a set of springs. The proof mass system moves normal to the substrate and the at least two guiding arms rotate anti-phase about a first axis in response to an acceleration of the MEMS sensor.

In a third aspect, a method provides a MEMS sensor with a Z axis accelerometer where a proof mass system of the MEMS sensor translates out of plane in response to a Z axis acceleration of the MEMS sensor.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

Figure 1:
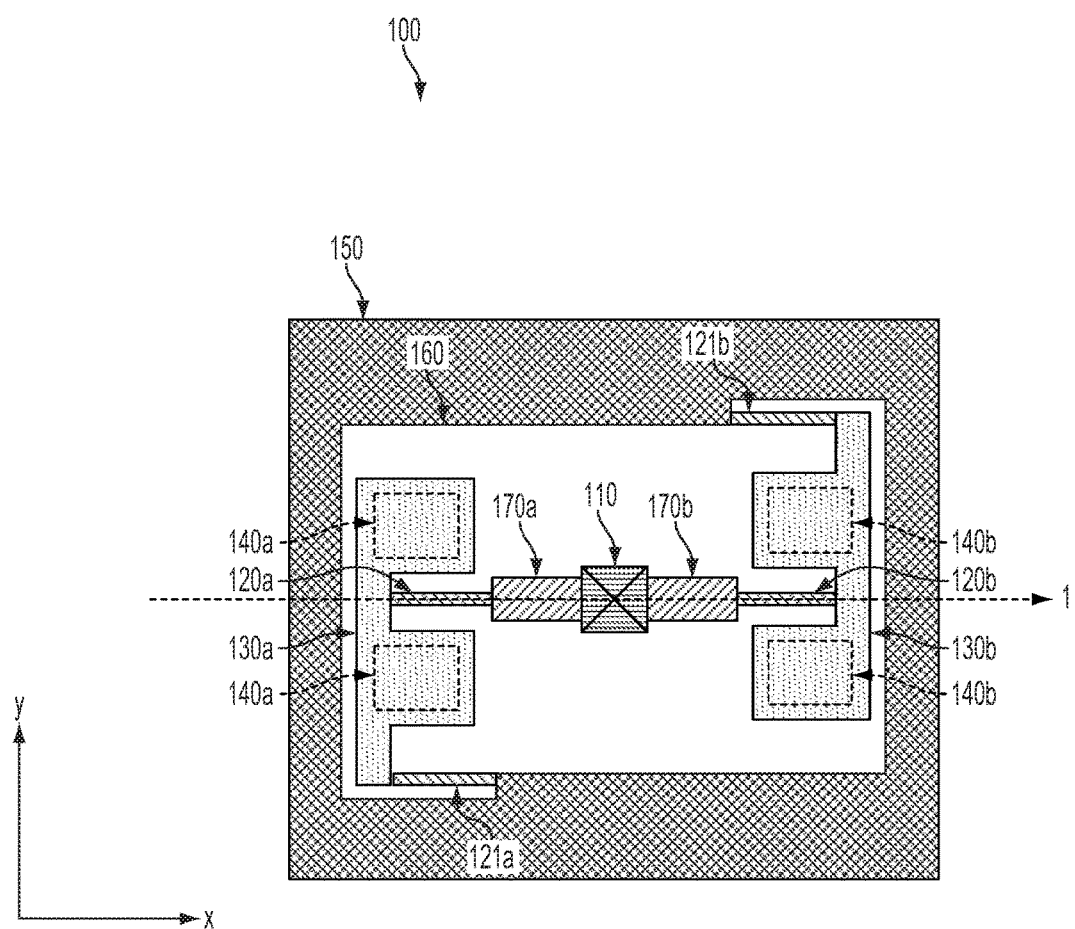
FIG. 1 illustrates a MEMS sensor in accordance with an embodiment.

The present invention relates to microelectromechanical system (MEMS) sensors, and more particularly, to MEMS Z axis accelerometers. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device (or MEMS sensor) may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

MEMS sensors experience a variety of undesirable forces and shock conditions that lead to the subsequent failure of the MEMS sensors. Over travel stops are placed to prevent damage to MEMS sensors when the MEMS sensors undergo an excitation that is outside its normal operating range. Excitations outside normal operating ranges are typically caused by a shock during the impact of a part (or the MEMS sensor itself) being dropped from a height and onto a hard surface.

MEMS Z axis accelerometer sensors utilize a proof mass that moves in response to a Z axis acceleration of the sensor. Conventionally, a Z axis MEMS sensor utilizes a rotational proof mass to convert forces applied to a proof mass to torque by eccentrically distributing the proof mass about a rotation axis and therefore, the mass distribution directly affects the sensitivity. Since the proof mass rotates, the largest Z axis travel is the location of the proof mass at the largest radius from the rotational axis. For the rotational MEMS Z accelerometer, the over travel stops are placed at the location of the proof mass at the largest radius from the rotational axis. Therefore, the over travel stops are constrained to being at a specific radius.

A system and method in accordance with the present invention provides a MEMS sensor that utilizes a translating MEMS Z accelerometer to measure forces applied to a proof mass system and therefore, the sensitivity of the accelerometer is independent of proof mass location. For the translating MEMS Z accelerometer, the over travel stops are placed at the proof mass system and therefore, are not constrained to being located at a specific radius like that of a rotating proof mass.

The MEMS sensor with a translating MEMS Z accelerometer has better performance over and is more robust than a conventional MEMS sensor with a rotational MEMS Z accelerometer. The translating MEMS Z accelerometer enables better performance by increasing the ratio of the total sensor travel to sensitivity. Total sensor travel is defined by the applied acceleration where the moving proof mass is just in contact with the over travel stop. By increasing the total sensor travel, a translating MEMS Z accelerometer improves robustness, reduces damage during the shock conditions, and reduces stiction (or when the moving section of the MEMS sensor gets stuck causing failures) during fabrication and operation.

In one embodiment, a MEMS sensor comprises an anchor region, at least one support arm coupled to the anchor region, at least two guiding arms coupled to the at least one support arm, a plurality of sensing elements coupled to the at least two guiding arms, and a proof mass system coupled to the at least two guiding arms by a first set of springs. In this embodiment, the proof mass system encircles the anchor region, the at least one support arm, the at least two guiding arms, the first set of springs, and the plurality of sensing elements. In another embodiment, the anchor region is comprised of multiple points connecting a substrate of the MEMS sensor to the at least one support arm.

To describe the features of the present invention in more detail, refer now to the following description in conjunction with the accompanying Figures.

FIG. 1 illustrates a MEMS sensor 100 in accordance with an embodiment. The MEMS sensor 100 comprises an anchor 110 coupled to a substrate 160, a first support arm 170a coupled to the anchor 110 and a second support arm 170b coupled to the anchor 110, a first rotating guide arm 130a coupled to the first support arm 170a by a first spring 120a, a second rotating guide arm 130b coupled to the second support arm 170b by a second spring 120b, a first set of sensing elements 140a coupled to the first rotating guide arm 130a, a second set of sensing elements 140b coupled to the second rotating guide arm 130b, a proof mass system 150 coupled to the first rotating guide arm 130a by a third spring 121a and coupled to the second rotating guide arm 130b by a fourth spring 121b.

In FIG. 1, the first set of sensing elements 140a detects the Z-axis motion of the first rotating guide arm 130a and the second set of sensing elements 140b detects the Z-axis motion of the second rotating guide arm 130b. The first and the second set of sensing elements 140a-b are coupled to the first and the second rotating guide arms 130a-b to form a variable capacitor to the substrate 160 that is situated below.

In FIG. 1, the proof mass system 150 encircles and encloses all other features including but not limited to the anchor 110, the first and the second support arms 170a-b, the first and the second springs 120a-b, the first and the second rotating guide arms 130a-b, and the first and the second set of sensing elements 140a-b. In another embodiment, the proof mass system 150 substantially encircles and encloses all other aforementioned features. In one embodiment, the anchor 110 is centered and in another embodiment, the anchor 110 is substantially located in the center of the first and the second set of sensing elements 140a-b.

In FIG. 1, a positive Z axis acceleration of the MEMS sensor 100 causes the proof mass system 150 to displace in the negative Z direction; additionally, the first rotating guide arm 130a rotates in the positive RX direction guiding the proof mass system 150 and the second rotating guide arm 130b rotates in the negative RX direction guiding the proof mass system 150. Therefore, the first and the second rotating guide arms 130a-b together guide the proof mass system 150 to move in the Z direction. The first set of sensing elements 140a detects the Z axis motion between the substrate 160 and the first rotating guide arm 130a and the second set of sensing elements 140b detects the Z axis motion between the substrate 160 and the second rotating guide arm 130b.

In one embodiment, the anchor 110 is a single central anchor that enables the manufacturing and development of a low offset accelerometer. In another embodiment, the anchor 110 is off center. In one embodiment, the first, second, third, and fourth springs 120a, 121a, 120b, and 121b respectively includes but is not limited to torsional springs. In one embodiment, the first spring provides torsional compliance along a first axis (labeled '1'). In one embodiment, the first axis is aligned with the X axis of the device. In one embodiment, the first and the second rotating guide arms 130a-b guide the proof mass system 150. In one embodiment, the first and the second set of sensing elements 140a-b are connected to the anchor 110. In another embodiment, the MEMS sensor 100 includes more than one anchor, more than four springs, more than two rotating guide arms that work together and in conjunction with each other to guide the proof mass system 150, and more than two sets of sensing elements.

Figure 2:
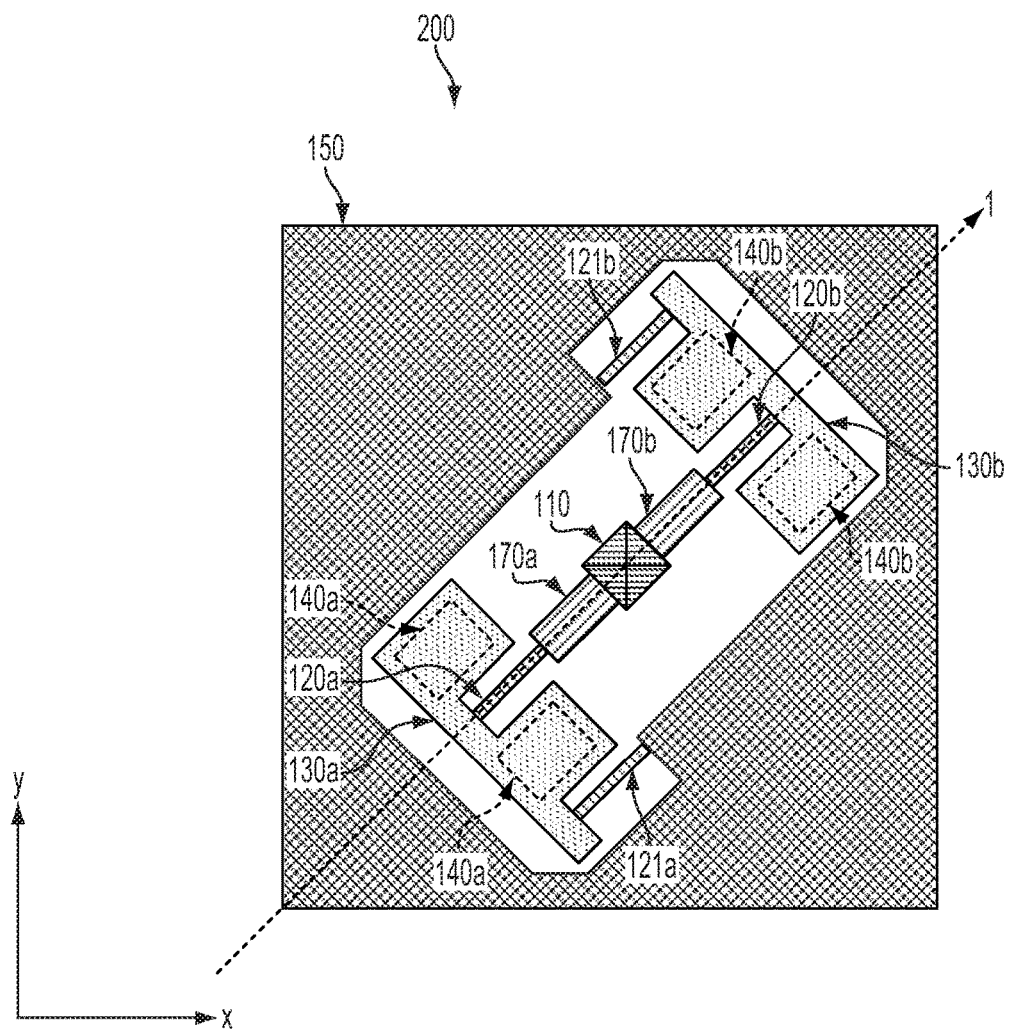
FIG. 2 illustrates a MEMS sensor in accordance with another embodiment.

FIG. 2 illustrates a MEMS sensor 200 in accordance with another embodiment. The MEMS sensor 200 of FIG. 2 is substantially similar to the MEMS sensor 100 of FIG. 1 except that the first axis (1) is not aligned with the X axis. This is advantageous as single crystal silicon has anisotropic properties where springs formed along the lowest elastic modulus can have a wider width making them more robust to imperfections during fabrication and to stress conditions, like that caused from shock. Since the sensitivity is independent of the location of the proof mass system, the springs 120a-b and 121a-b can be placed to take advantage of the anisotropic properties of single crystal silicon.

Figure 3:
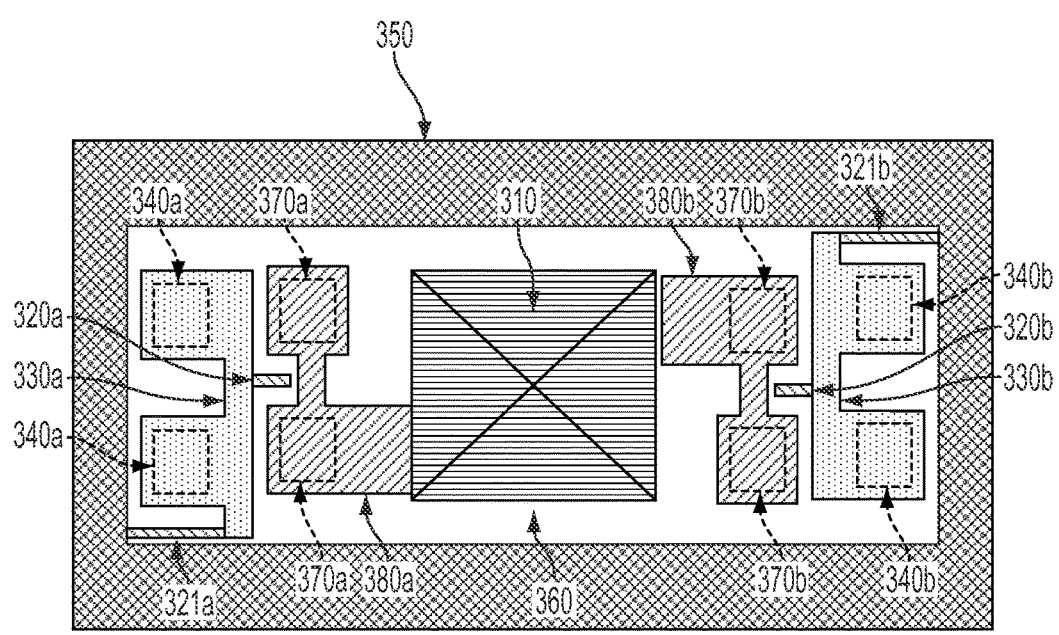
FIG. 3 illustrates a MEMS sensor in accordance with another embodiment.

FIG. 3 illustrates a MEMS sensor 300 in accordance with another embodiment. The MEMS sensor 300 comprises an anchor 310 coupled to a substrate 360, a first rotating guide arm 330a coupled to a first support arm 380a via spring 320a, a second rotating guide arm 330b coupled to a second support arm 380b via spring 320b, a first set of sensing elements 340a coupled to the first rotating guide arm 330a, a second set of sensing elements 340b coupled to the second rotating guide arm 330b, a proof mass system 350 coupled to both the first rotating guide arm 330a via spring 321a and to the second rotating guide arm 330b via spring 321b.

In FIG. 3, the first and the second support arms 380a-b are fixed and are rigidly coupled to the anchor 310. Therefore, in FIG. 3, the MEMS sensor 300 includes both the first and second set of sensing elements 340a-b and a third and fourth set of sensing elements 370a-b. The third and fourth set of sensing elements 370a-b are used to calibrate out undesirable motion of the anchor 310 which can come from fabrication, packaging, thermal loading, shock, package mounting, and more.

Figure 4:
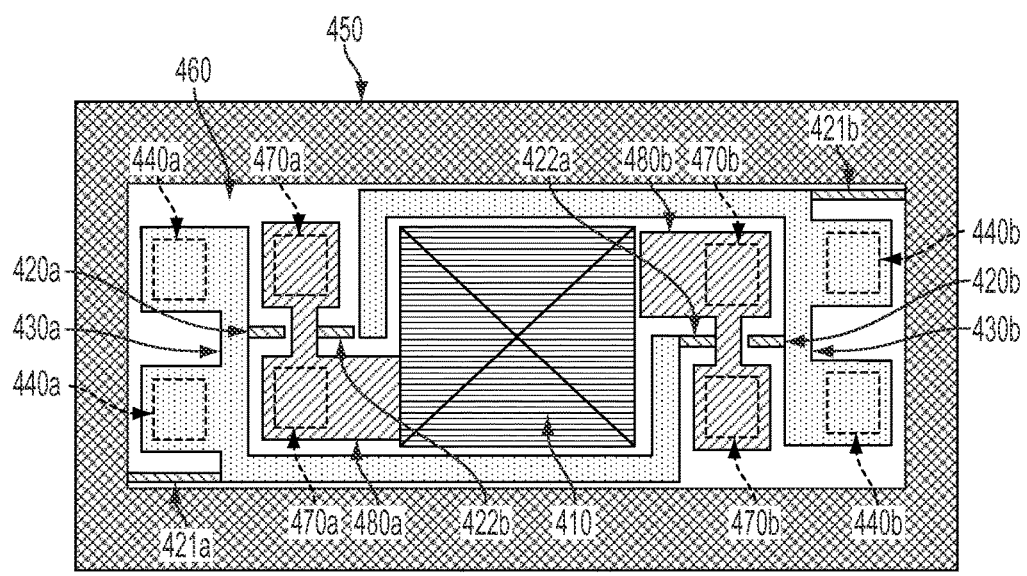
FIG. 4 illustrates a MEMS sensor in accordance with another embodiment.

FIG. 4 illustrates a MEMS sensor 400 in accordance with another embodiment. The MEMS sensor 400 of FIG. 4 is substantially similar to the MEMS sensor 300 of FIG. 3 except that there are two additional springs 422a and 422b of FIG. 4 that couple the rotating guide arm 430a and 430b to both the left and the right side of an anchor 410.

Thus, in FIG. 4, the MEMS sensor 400 comprises the anchor 410 coupled to a substrate 460, a first extended rotating guide arm 430a coupled both to a first support arm 480a via spring 420a and to a second support arm 480b via spring 422a, the second rotating guide arm 430b coupled both to a second support arm 480b via spring 420b and to the first support arm 480a via spring 422b, a first set of sensing elements 440a coupled to the first rotating guide arm 430a, a second set of sensing elements 440b coupled to the second extended rotating guide arm 430b, a proof mass system 450 coupled to both the first extended rotating guide arm 430a via spring 421a and to the second extended rotating guide arm 430b via spring springs 421b.

Accordingly, in FIG. 4, both the first and the second extended rotating guide arms 430*a-b* are attached to the left and the right side of the anchor 410 via an additional spring 422*a-b* via the first and the second support arms 480*a-b*. Extending the first and the second rotating guide arms 430*a-b* adds RZ rotational stiffness. Low RZ stiffness can lead to an undesirable in-plane motion of the sensor. This in-plane motion can couple to the out-of-plane motion via imperfections causing false signals. In FIG. 4, similar to the support arms of FIG. 2 and FIG. 3, the first and the second support arms 480*a-b* are rigidly coupled to the anchor 410 and a third set and a fourth set of sensing elements 470*a-b* to detect the motion of each support arm. The third and the fourth set of sensing elements 470*a-b* are used to calibrate out undesirable motion of the anchor 410 which can come from fabrication, packaging, thermal loading, shock, package mounting, and more. Therefore, in FIG. 4, in addition to a first and a second set of sensing elements 440*a-b*, the MEMS sensor 400 includes the third and the fourth set of sensing elements 470*a-b*.

Figure 5:
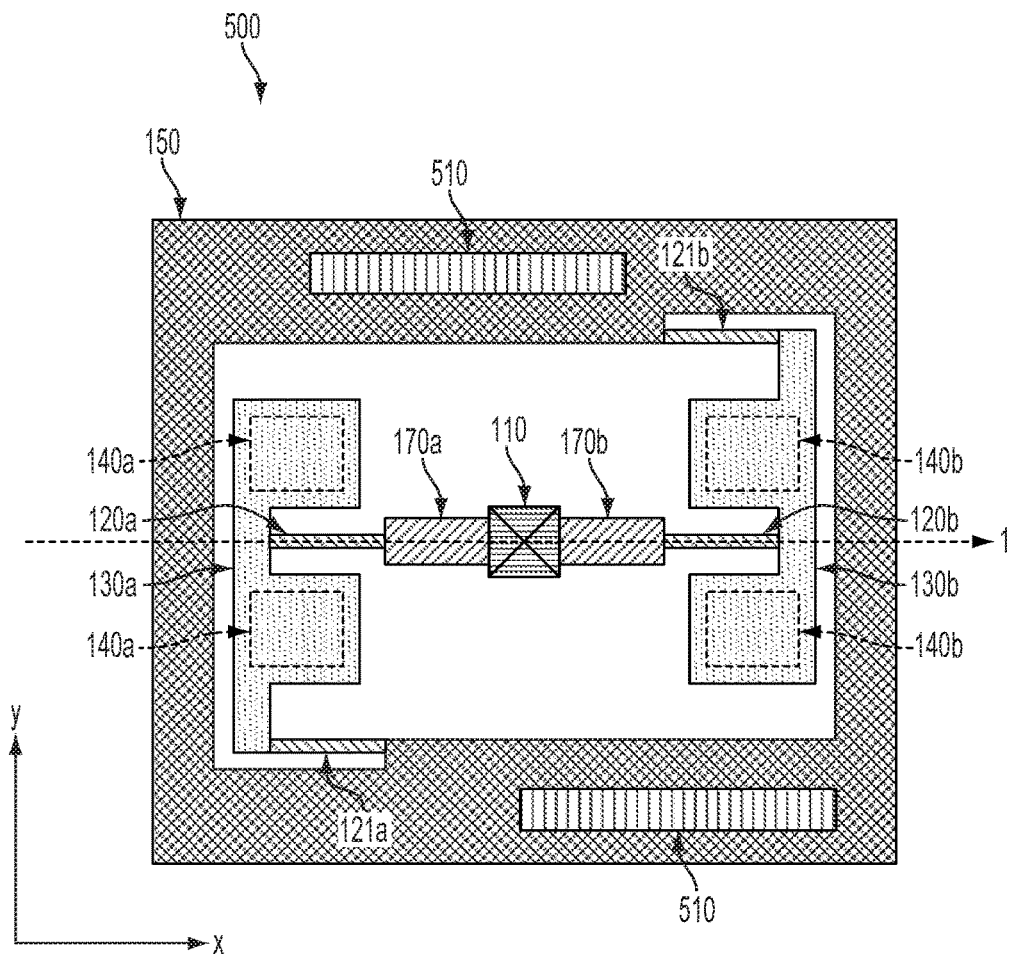
FIG. 5 illustrates a MEMS sensor in accordance with another embodiment.

FIG. 5 illustrates a MEMS sensor 500 in accordance with another embodiment. The MEMS sensor 500 of FIG. 5 is substantially similar to the MEMS sensor 100 of FIG. 1 except that the proof mass system 150 further includes a magnetic material 510. When the MEMS sensor 500 is placed in a Z axis magnetic field, the proof mass system 150 rotates about a first axis (labeled '1') causing the first and the second rotating guide arms 130*a-b* to rotate in-phase. The plurality of sensing elements 140*a-b* are utilized to measure the motion of the first and the second rotating guide arms 130*a-b* and a signal processor is used to output a signal proportional to the applied magnetic field.

A method and system in accordance with the present invention provides a MEMS sensor with a translating Z axis accelerometer. In a first embodiment, the MEMS sensor comprises an anchor region, at least one support arm, at least two guiding arms (or at least two rotating guide arms) coupled to the at least one support arm, a plurality of sensing elements coupled to the at least two guiding arms, and a proof mass system coupled to the at least two guiding arms by a first set of springs, wherein the proof mass system encircles the anchor region, the at least one support arm, the at least two guiding arms, the first set of springs, and the plurality of sensing elements.

In one embodiment, the at least one support arm comprises at least two support arms. In this embodiment, a first of the at least two guiding arms is coupled to the anchor region via a first of the at least two support arms by a first set of springs and a second of the at least two guiding arms is coupled to the anchor region via a second of the at least two support arms by a second set of springs. In one embodiment, a plurality sensing elements are coupled to the at least two support arms. In one embodiment, the at least two guiding arms are coupled together by a third set of springs and both the second and the third set of springs increase the in-plane rotational modal frequency.

In one embodiment, the first set of springs is formed along a minimum elastic modulus plane of a single crystal silicon at 45 degrees. In another embodiment, the first set of springs is formed along a maximum elastic modulus plane of a single crystal silicon at any of 0 and 90 degrees. In another embodiment, the first set of springs is formed along any axis of crystal orientation that includes but is not limited to all angles. In another embodiment, the second and the third set of springs are similarly formed as the first set of springs.

In one embodiment, the plurality of sensing elements comprises a plurality of sensing electrodes that detect the Z axis motion of the at least two guiding arms. In one embodiment, any of the first, second, and third set of springs are torsional springs. In one embodiment, the anchor region is substantially located in the center of the plurality of sensing elements.

In one embodiment, acceleration of the MEMS sensor causes two of the at least two guiding arms to rotate anti-phase further causing the proof mass system to move in the Z axis. In one embodiment, the anchor region is a single central anchor that is coupled to a substrate. In one embodiment, the plurality of sensing elements is coupled to the at least two guiding arms to form a variable capacitor to the substrate. In one embodiment, the at least two guiding arms are extended to couple to each of the at least two support arms thereby increasing RZ rotational stiffness. In one embodiment, a signal processor is coupled to the plurality of sensing elements and outputs a signal proportional to the acceleration of the MEMS sensor along a direction normal to the substrate.

In a second embodiment, the MEMS sensor comprises a substrate, an anchor region coupled to the substrate, at least one support arm coupled to the anchor region, at least two guiding arms coupled to the at least one support arm, wherein the at least two guiding arms move relative to the at least one support arm, a first plurality of sensing elements disposed on the at least two guiding arms to measure motion of the at least two guiding arms relative to the substrate, and a proof mass system coupled to each of the at least two guiding arms via a first set of springs, wherein the proof mass system is disposed outside the anchor region, the at least one support arm, the at least two guiding arms, the first set of springs, and the first plurality of sensing elements.

In one embodiment, the anchor region comprises at least one anchoring point on the substrate, the proof mass system comprises any of at least one proof mass and a plurality of proof masses coupled together with a plurality of springs, the at least two guiding arms are coupled to the at least one support arm via a second set of springs and wherein two of the at least two guiding arms rotate anti-phase relative to each other. In one embodiment, the MEMS sensor further comprises a second plurality of sensing elements disposed on the at least one support arm to measure the motion of the at least one support arm relative to the substrate.

In one embodiment, each of the at least two guiding arms are coupled to the at least one support arm by a third set of springs, wherein any of the first, the second, and the third set of springs provide torsional compliance. In one embodiment, the second and the third set of springs on each of the at least two guiding arms are disposed on opposite sides of the anchor region and provide torsional compliance about a first axis.

In one embodiment, the MEMS sensor is made from single crystal silicon, wherein the second set of springs are aligned with a first axis, wherein the first axis is aligned with a low modulus of elasticity, 100 and 010 planes, of single crystal silicon. In one embodiment, the first and the second plurality of sensing elements comprises a plurality of sensing electrodes, wherein the first plurality of sensing elements detects motion normal to the substrate of the at least two guiding arms and the second plurality of sensing elements detects motion normal to the substrate of the at least one support arm.

In one embodiment, the proof mass system moves normal to the substrate and the at least two guiding arms rotate anti-phase in response to acceleration of the MEMS sensor along a direction normal to the substrate, wherein a signal processor combines signals from the first plurality of sensing elements to output a signal proportional to the acceleration of the MEMS sensor along the direction normal to the substrate.

In one embodiment, the proof mass system moves normal to the substrate and the at least two guiding arms rotate anti-phase in response to acceleration of the MEMS sensor along a direction normal to the substrate, wherein a signal processor combines signals from the first and the second plurality of sensing elements to output a signal proportional to the acceleration of the MEMS sensor along the direction normal to the substrate.

In one embodiment, the first plurality of sensing elements are a plurality of sensing electrodes on the substrate that form variable capacitors between the substrate and the at least two guiding arms and the second plurality of sensing elements are a plurality of sensing electrodes on the substrate that form variable capacitors between the substrate and the at least one support arm.

In one embodiment, the proof mass system further comprises a magnetic material, wherein two of the at least two guiding arms rotates in-phase about a first axis in response to an ambient magnetic field. In one embodiment, a signal processor combines signals from the first plurality of sensing elements to measure the in-phase rotation of the at least two rotating guiding arms to output a signal proportional to the ambient magnetic field. In another embodiment, a signal processor combines the first and the second plurality of sensing elements to measure the in-phase rotation of the at least two rotating guiding arms to output a signal proportional to the ambient magnetic field.

In a third embodiment, the MEMS sensor comprises a substrate, an anchor region coupled to the substrate, at least one support arm coupled to the anchor region, at least two guiding arms coupled to the at least one support arm, wherein the at least two guiding arms move relative to the at least one support arm, a first plurality of sensing elements disposed on the substrate to measure motion of the at least two guiding arms relative to the substrate, and a proof mass system coupled to each of the at least two guiding arms via a first set of springs, wherein the proof mass system moves normal to the substrate and the at least two guiding arms rotate anti-phase about a first axis in response to an acceleration of the MEMS sensor. In one embodiment, the proof mass system comprises a plurality of proof masses coupled together with a plurality of springs.

In one embodiment, the MEMS sensor further comprises a second plurality of sensing electrodes disposed on the substrate to detect motion of the at least one support arm normal to the substrate. In one embodiment, the MEMS sensor further comprises a second and a third set of springs that couple the at least one support arm to the at least two guiding arms, wherein the second and the third set of springs are disposed on opposite sides of the anchor region.

In one embodiment, the first plurality of sensing electrodes are disposed symmetrically about the anchor region and the second plurality of sensing electrodes are disposed symmetrically about the anchor region. In one embodiment, a signal processor combines the first plurality of sensing electrodes to output a signal proportional to the acceleration of the MEMS sensor. In another embodiment, a signal processor combines the first and the second plurality of sensing electrodes to output a signal proportional to the acceleration of the MEMS sensor.

As above described, a system (MEMS sensor) and a method in accordance with the present invention provides a MEMS sensor that utilizes a translating accelerometer to increase performance by reducing the constraints on the placement of the over travel stops. For a given sensitivity, a translating accelerometer has a larger total sensor travel in comparison to a rotational accelerometer. The increase in the total sensor travel (or full travel) improves the robustness of the MEMS sensor during a shock condition and/or undesirable force and also decreases stiction during the fabrication and operation of the MEMS sensor.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS sensor, comprising:
    a substrate;
    an anchor region coupled to the substrate, wherein the anchor region comprises all anchoring to the substrate;
    a first support arm coupled to the anchor region;
    a second support arm coupled to the anchor region;
    a first guiding arm coupled to the first support arm, wherein the first guiding arm moves relative to the first support arm;
    a second guiding arm coupled to the second support arm, wherein the second guiding arm moves relative to the second support arm;
    a first plurality of sensing elements to measure motion of the first guiding arm and the second guiding arm relative to the substrate; and
    a proof mass system coupled to the first guiding arm via a first spring of a first set of springs and coupled to the second guiding arm via a second spring of the first set of springs, wherein the proof mass system is disposed outside the anchor region, the first support arm, the second support arm, the first guiding arm, the second guiding arm, the first set of springs, and the first plurality of sensing elements.

2. The MEMS sensor of claim 1, wherein the anchor region comprises at least one anchoring point on the substrate.

3. The MEMS sensor of claim 1, wherein the proof mass system comprises at least one proof mass.

4. The MEMS sensor of claim 1, wherein the first guiding arm is coupled to the first support arm via a first spring of a second set of springs and the second guiding arm is coupled to the second support arm via a second spring of the second set of springs.

5. The MEMS sensor of claim 1, wherein the first guiding arm rotates anti-phase relative to the second guiding arm.

6. The MEMS sensor of claim 1, further comprising:
    a second plurality of sensing elements to measure the motion of the first support arm and the second support arm relative to the substrate.

7. The MEMS sensor of claim 4, wherein the first guiding arm is coupled to the first support arm via a first spring of a third set of springs and the second guiding arm is coupled to the second support arm via a second spring of the third set of springs.

8. The MEMS sensor of claim 7, wherein the first spring of the second set of springs and the first spring of the third set of springs are disposed on an opposite side of the anchor region as the second spring of the second set of springs and the second spring of the third set of springs.

9. The MEMS sensor of claim 7, wherein any of the first, the second, and the third set of springs provide torsional compliance.

10. The MEMS sensor of claim 7, wherein the second and the third set of springs provide torsional compliance about a first axis.

11. The MEMS sensor of claim 1, wherein the MEMS sensor is made from single crystal silicon.

12. The MEMS sensor of claim 4, wherein the second set of springs are aligned with a first axis, wherein the first axis is aligned with a low modulus of elasticity, 100 and 010 planes, of single crystal silicon.

13. The MEMS sensor of claim 6, wherein the first and the second plurality of sensing elements comprises a plurality of sensing electrodes.

14. The MEMS sensor of claim 1, wherein the first plurality of sensing elements detects motion normal to the substrate of the first guiding arm and the second guiding arm.

15. The MEMS sensor of claim 6, wherein the second plurality of sensing elements detects motion normal to the substrate of the first support arm and the second support arm.

16. The MEMS sensor of claim 1, wherein the proof mass system moves normal to the substrate and the first guiding arm and the second guiding arm rotate anti-phase in response to acceleration of the MEMS sensor along a direction normal to the substrate.

17. The MEMS sensor of claim 16, wherein a signal processor combines signals from the first plurality of sensing elements to output a signal proportional to the acceleration of the MEMS sensor along the direction normal to the substrate.

18. The MEMS sensor of claim 6, wherein the proof mass system moves normal to the substrate and the first guiding arm and the second guiding arm rotate anti-phase in response to acceleration of the MEMS sensor along a direction normal to the substrate.

19. The MEMS sensor of claim 18, wherein a signal processor combines signals from the first and the second plurality of sensing elements to output a signal proportional to the acceleration of the MEMS sensor along the direction normal to the substrate.

20. The MEMS sensor of claim 1, wherein the first plurality of sensing elements are a plurality of sensing electrodes on the substrate that form variable capacitors between the substrate and the first guiding arm and the second guiding arm.

21. The MEMS sensor of claim 6, wherein the second plurality of sensing elements are a plurality of sensing electrodes on the substrate that form variable capacitors between the substrate and the first support arm and the second support arm.

22. The MEMS sensor of claim 1, wherein the proof mass system further comprises:
a magnetic material, wherein the first guiding arm and the second guiding arm rotate in-phase about a first axis in response to an ambient magnetic field.

23. The MEMS sensor of claim 22, wherein a signal processor combines signals from the first plurality of sensing elements to measure the in-phase rotation of the first guiding arm and the second guiding arm to output a signal proportional to the ambient magnetic field.

24. The MEMS sensor of claim 6, wherein the proof mass system further comprises:
a magnetic material, wherein two of the first guiding arm and the second guiding arm rotate in-phase about a first axis in response to an ambient magnetic field.

25. The MEMS sensor of claim 24, wherein a signal processor combines the first and the second plurality of sensing elements to measure the in-phase rotation of the first guiding arm and the second guiding arm to output a signal proportional to the ambient magnetic field.

26. A MEMS sensor, comprising:
a substrate;
an anchor region coupled to the substrate, wherein the anchor region comprises all anchoring to the substrate;
a first support arm coupled to the anchor region;
a second support arm coupled to the anchor region;
a first guiding arm coupled to the first support arm, wherein the first guiding arm moves relative to the first support arm;
a second guiding arm coupled to the second support arm, wherein the second guiding arm moves relative to the second support arm;
a first plurality of sensing electrodes disposed on the substrate to measure motion of the first guiding arm and the second guiding arm relative to the substrate; and
a proof mass system coupled to the first guiding arm via a first spring of a first set of springs and coupled to the second guiding arm via a second spring of the first set of springs, wherein the proof mass system moves normal to the substrate and the first guiding arm and the second guiding arm rotate anti-phase about a first axis in response to an acceleration of the MEMS sensor, and wherein the proof mass system is disposed outside the anchor region, the first support arm, the second support arm, the first guiding arm, the second guiding arm, the first set of springs, and the first plurality of sensing elements.

27. The MEMS sensor of claim 26, further comprising:
a second plurality of sensing electrodes disposed on the substrate to detect motion of the first support arm and the second support arm normal to the substrate.

28. The MEMS sensor of claim 26, wherein the first guiding arm is coupled to the first support arm via a first spring of a second set of springs and a first spring of a third set of springs and the second guiding arm is coupled to the second support arm via a second spring of the second set of springs and a second spring of the third set of springs, wherein the first spring of the second set of springs and the first spring of the third set of springs are disposed on an opposite side of the anchor region as the second spring of the second set of springs and the second spring of the third set of springs.

29. The MEMS sensor of claim 26, wherein the first plurality of sensing electrodes are disposed symmetrically about the anchor region.

30. The MEMS sensor of claim 27, wherein the second plurality of sensing electrodes are disposed symmetrically about the anchor region.

31. The MEMS sensor of claim 26, wherein a signal processor combines the first plurality of sensing electrodes to output a signal proportional to the acceleration of the MEMS sensor.

32. The MEMS sensor of claim 27, wherein a signal processor combines the first and the second plurality of sensing electrodes to output a signal proportional to the acceleration of the MEMS sensor.

33. The MEMS sensor of claim 1, wherein the anchor region comprises a single central anchor coupled to the substrate.

34. The MEMS sensor of claim 1, wherein the anchor region comprises a single anchor coupled to the substrate, wherein the single anchor is off center.

* * * * *